United States Patent
Lu

(10) Patent No.: US 10,445,554 B2
(45) Date of Patent: Oct. 15, 2019

(54) PACKAGE STRUCTURE OF FINGERPRINT IDENTIFICATION CHIP

(71) Applicant: Primax Electronics Ltd., Taipei (TW)

(72) Inventor: Tsung-Yi Lu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 115 days.

(21) Appl. No.: 15/830,796

(22) Filed: Dec. 4, 2017

(65) Prior Publication Data

US 2019/0065820 A1 Feb. 28, 2019

(30) Foreign Application Priority Data

Aug. 25, 2017 (TW) .............................. 106129026 A

(51) Int. Cl.
*G06K 9/00* (2006.01)
*H01L 23/04* (2006.01)
(Continued)

(52) U.S. Cl.
CPC .......... *G06K 9/00087* (2013.01); *H01L 23/04* (2013.01); *H01L 23/08* (2013.01); *H01L 23/10* (2013.01); *H01L 23/13* (2013.01); *H01L 23/3142* (2013.01); *H01L 23/481* (2013.01); *H01L 23/4985* (2013.01); *H01L 23/49833* (2013.01); *H01L 23/562* (2013.01);
(Continued)

(58) Field of Classification Search
CPC .............. G06K 9/00087; H01L 23/481; H01L 23/49833; H01L 23/13; H01L 23/3142; H01L 24/73; H01L 23/562; H01L 23/08; H01L 23/10; H01L 24/32; H01L 24/48; H01L 24/05; H01L 23/4985; H01L 23/04; H01L 23/145; H01L 23/525; H01L 2924/181; H01L 2224/73265; H01L 2224/32225; H01L 2224/48091; H01L 23/15; H01L 2224/48227; H01L 2224/48106; H01L 2224/04042
USPC ......................................................... 382/124
See application file for complete search history.

(56) References Cited

U.S. PATENT DOCUMENTS 10,061,966 B2 * 8/2018 Lee ...................... G06K 9/0002
2015/0294135 A1 * 10/2015 Kim ........................ H01L 23/04
382/124

(Continued)

*Primary Examiner* — Van D Huynh
(74) *Attorney, Agent, or Firm* — Kirton McConkie; Evan R. Witt

(57) ABSTRACT

The present invention provides a package structure of a fingerprint identification chip, including: a substrate, having a first surface, a second surface and a penetrating opening, the second surface including a groove extending from the penetrating opening and a second metal contact, and the groove being used for accommodating a first metal contact; a fingerprint identification chip having an upper surface and a lower surface, the fingerprint identification being disposed in the penetrating opening and having a bonding pad on the lower surface; a cover plate, fixedly disposed on the first surface of the substrate and covering the upper surface of the fingerprint identification chip; and a flexible print circuit (FPC), disposed on the second surface of the substrate, a surface of the FPC having a third metal contact that corresponds to and is electrically connected to the second metal contact, where bonding pad is electrically connected to the first metal contact through a wire.

15 Claims, 3 Drawing Sheets

(51) Int. Cl.
*H01L 23/498* (2006.01)
*H01L 23/00* (2006.01)
*H01L 23/10* (2006.01)
*H01L 23/08* (2006.01)
*H01L 23/31* (2006.01)
*H01L 23/13* (2006.01)
*H01L 23/48* (2006.01)
H01L 23/15 (2006.01)
H01L 23/14 (2006.01)
H01L 23/525 (2006.01)

(52) U.S. Cl.
CPC .............. *H01L 24/05* (2013.01); *H01L 24/32* (2013.01); *H01L 24/48* (2013.01); *H01L 24/73* (2013.01); *H01L 23/145* (2013.01); *H01L 23/15* (2013.01); *H01L 23/525* (2013.01); *H01L 2224/04042* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2924/00014* (2013.01); *H01L 2924/181* (2013.01)

(56) References Cited

U.S. PATENT DOCUMENTS

| | | | |
|---|---|---|---|
| 2017/0243045 A1* | 8/2017 | Chang | G06K 9/0002 |
| 2017/0287797 A1* | 10/2017 | Wang | H01L 23/32 |
| 2018/0015711 A1* | 1/2018 | Wu | B32B 37/1284 |
| 2018/0054313 A1* | 2/2018 | Wu | G06F 21/32 |
| 2018/0145102 A1* | 5/2018 | Wang | G06K 9/0002 |

* cited by examiner

PACKAGE STRUCTURE OF FINGERPRINT IDENTIFICATION CHIP

FIELD OF THE INVENTION

The present invention relates to the field of chip package applications, and in particular, to a package structure of a fingerprint identification chip.

BACKGROUND OF THE INVENTION

With the advance in science and technology, fingerprint recognition modules with a fingerprint recognition function have been widely set in electronic devices and have become one of the standard configurations of the electronic devices. A user may carry out identity recognition by using the fingerprint recognition module, so as to further unlock the electronic device or perform an operation on a software interface.

In the prior art, as shown in FIG. 1, FIG. 1 is a cross-sectional view of a conventional package structure of a fingerprint identification chip. In FIG. 1, a fingerprint identification module 20 is packaged by using a land grid array (LGA) technology and includes: a fingerprint identification chip 21, a substrate 22, an epoxy molding compound (EMC) layer 23 covering the fingerprint identification chip 21 and the substrate 22, a cover plate 24, a flexible print circuit (FPC) 25, and a reinforcing plate 26. An upper surface of the fingerprint identification chip 21 is provided with a bonding pad 211. The substrate 25 is provided with a metal contact 221. The bonding pad 211 is electrically connected to the metal contact 221 through a wire W.

In the prior art, the thickness of the cover plate 24 of the fingerprint identification module 20 is between 120 μm and 250 μm. The thickness of the substrate 22 is between 130 μm and 310 μm. The thickness of the fingerprint identification chip 21 is between 150 μm and 400 μm. In order to protect the wire W and maintain mechanical strength thereof, the thickness of the EMC layer 23 is usually the thickness of the fingerprint identification chip 21 plus 50 μm. The thickness of the FPC 25 and the thickness of the reinforcing plate 26 are both 120 μm. In addition, after packaging is completed, it is necessary to add the thickness of a pouring sealant, which is approximately 20 μm, and the thickness of tin soldering, which is approximately 60 μm. In the current trend of making electronic devices lighter and thinner, although the thickness of the fingerprint identification module 20 manufactured by using a conventional packaging technology can be as thin as 770 μm, the shrinkage characteristic of packaging materials may cause the fingerprint identification module 20 to warp and cause the fingerprint identification module 20 to lose the due mechanical strength.

Accordingly, how to provide a package structure of a fingerprint identification chip so that the fingerprint identification chip can avoid warping while maintaining desirable mechanical strength thereof during a thinning process is a technical issue to be solved by the present invention.

SUMMARY OF THE INVENTION

A main objective of the present invention is to provide a package structure of a fingerprint identification chip that is thin while maintaining good mechanical strength.

To achieve the foregoing objective, the present invention provides a package structure of a fingerprint identification chip, including:

a substrate, having a first surface, a second surface and a penetrating opening penetrating the first surface and the second surface, the second surface including a groove extending from the penetrating opening and a second metal contact, and the groove being used for accommodating a first metal contact;

a fingerprint identification chip, disposed in the penetrating opening and having an upper surface and a lower surface, the lower surface having a bonding pad;

a cover plate, fixedly disposed on the first surface of the substrate and covering the upper surface of the fingerprint identification chip; and an FPC, disposed on the second surface of the substrate, a surface of the FPC having a third metal contact that corresponds to and is electrically connected to the at least one second metal contact, where the bonding pad is electrically connected to the first metal contact through a wire.

In the foregoing preferred implementation, the package structure further includes a reinforcing plate, where the reinforcing plate is disposed on another surface, which is opposite to the surface having the at least one third metal contact, of the FPC.

In the foregoing preferred implementation, a colloid is coated on the bonding pad, the wire and the first metal contact, and the colloid is an underfill.

In the foregoing preferred implementation, a first film layer is formed between the cover plate and the first surface of the substrate and is used for bonding the substrate and the cover plate.

In the foregoing preferred implementation, the cover plate includes a mucilage layer that is formed at a position corresponding to the penetrating opening and is used for bonding the upper surface of the fingerprint identification chip.

In the foregoing preferred implementation, a second film layer is formed between the flexible circuit and the reinforcing plate and is used for bonding the flexible circuit and the reinforcing plate.

In the foregoing preferred implementation, the substrate is: a bakelite board, a glass-fiber board, a plastic sheet or a ceramic plate.

In the foregoing preferred implementation, a material of the cover plate is: ceramic or glass.

In the foregoing preferred implementation, a material of the reinforcing plate is: stainless steel, tungsten steel, aluminum or tin plate.

In the foregoing preferred implementation, the thickness of the substrate is between 295 μm and 305 μm.

In the foregoing preferred implementation, the thickness of the substrate is 300 μm.

In the foregoing preferred implementation, the thickness of the cover plate is between 90 μm and 110 μm.

In the foregoing preferred implementation, the thickness of the cover plate is 100 μm.

In the foregoing preferred implementation, the thickness of the reinforcing plate is between 145 μm and 155 μm.

In the foregoing preferred implementation, the thickness of the reinforcing plate is 150 μm.

DETAILED DESCRIPTION OF THE PREFERRED EMBODIMENT

Advantages and features of the present invention and methods for achieving the advantages and features will be described in further detail with reference to the exemplary embodiments and accompanying drawings, so as to be easier to understand. However, the present invention may be implemented in different forms and should not be construed as being limited to the embodiments described herein. On the contrary, for a person of ordinary skill in the art, the provided embodiments make this disclosure more thorough and comprehensive, and convey the scope of the present invention more completely.

Figure 1:
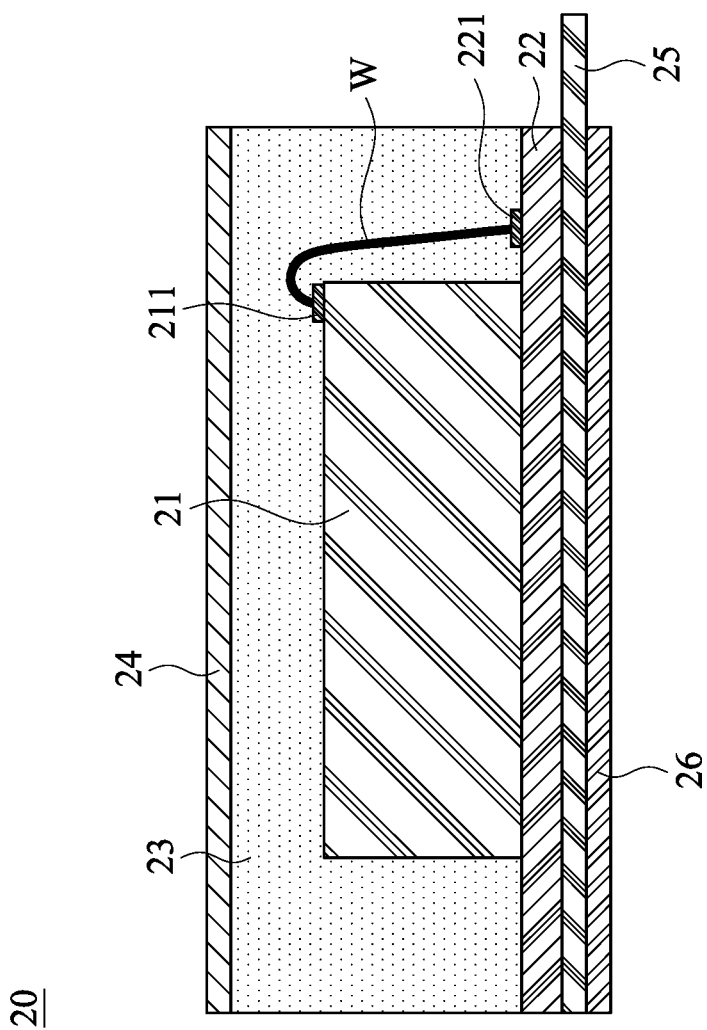
FIG. 1 is a cross-sectional view of a conventional package structure of a fingerprint identification chip.
Figure 2:
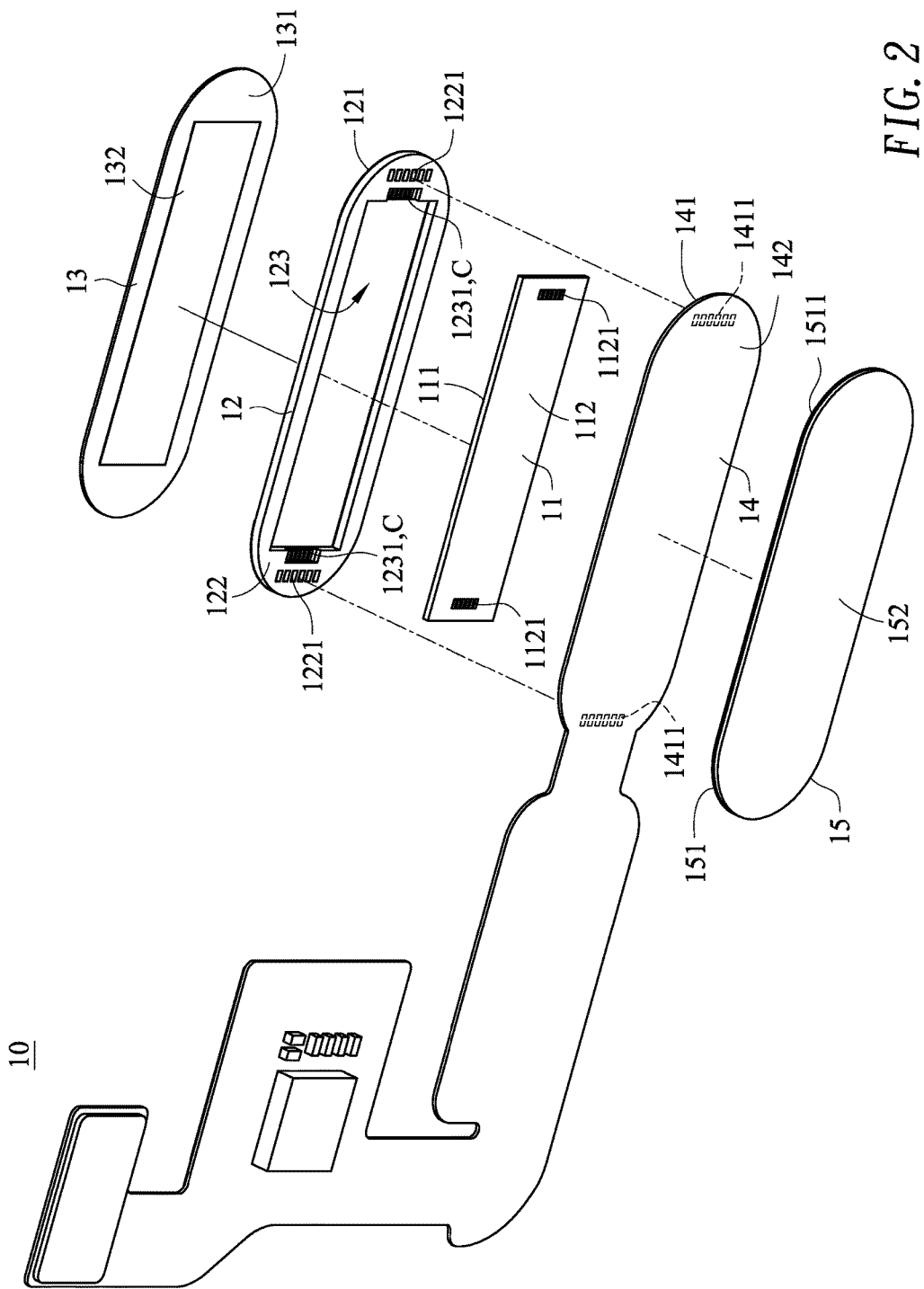
FIG. 2 is a three-dimensional exploded view of a package structure of a fingerprint identification chip according to the present invention.

First, referring to FIG. 2, FIG. 2 is a three-dimensional exploded view of a package structure of a fingerprint identification chip according to the present invention. In FIG. 2, the package structure 10 of a fingerprint identification chip includes: a fingerprint identification chip 11, a substrate 12, a cover plate 13, an FPC 14, and a reinforcing plate 15.

Referring to FIG. 2 continuously, the fingerprint identification chip 11 has an upper surface 111 and a lower surface 112. In the design of the present invention, bonding pads 1121 of the fingerprint identification chip 11 are arranged on two opposite side edges of the lower surface 112 of the fingerprint identification chip 11 by using a through silicon via (TSV) process technology. Although the present invention proposes an implementation of arranging the bonding pads 1121 of the fingerprint identification chip 11 on two opposite side edges of the lower surface 112 by using the TSV process technology, the bonding pads 1121 may also be centrally arranged on either side edge of the lower surface 112 of the fingerprint identification chip 11 by using the TSV process technology and a redistribution layer (RDL) process technology during actual application. The arrangement of the bonding pads 1121 is not limited to the implementation proposed in the present invention.

The substrate 12 has a first surface 121, a second surface 122 and a penetrating opening 123 penetrating the first surface 121 and the second surface 122. The second surface 122 is provided with two second metal contacts 1221 and two grooves 1231 extending from two opposite side edges of the penetrating opening 123. The groove 1231 is used for accommodating a first metal contact C. The penetrating opening 123 is used for accommodating the fingerprint identification chip 11. A material of the substrate 12 of the present invention may be: a bakelite board, a glass-fiber board, a plastic sheet or a ceramic plate.

A surface of the cover plate 13 includes: a first film layer 131 and a mucilage layer 132. The first film layer 131 is used for bonding the cover plate 13 with the first surface 121 of the substrate 12. The mucilage layer 132 is arranged at a position corresponding to the penetrating opening 123 and is used for bonding the upper surface 111 of the fingerprint identification chip 11. The first film layer 131 is a hot-pressing double-sided adhesive. The mucilage layer 132 is a thermosetting hydrogel. A material of the cover plate 13 may be: ceramic or glass. In a preferred implementation, the cover plate 13 is made of sapphire glass. Although the present invention proposes an implementation of arranging the first film layer 131 and the mucilage layer 132 on the surface of the cover plate 13, it is also possible to arrange the first film layer 131 on the first surface 121 of the substrate 12 or arrange the mucilage layer 132 on the upper surface 111 of the fingerprint identification chip 11. The arrangement manner is not limited to the implementation proposed in the present invention.

The FPC 14 has an upper surface 141 and a lower surface 142 opposite to the upper surface 141. Two third metal contacts 1411 are arranged on the upper surface 141 of the FPC 14. Positions where the third metal contacts 1411 are arranged correspond to positions where the second metal contacts 1221 are arranged on the second surface 122 of the substrate 12. The third metal contacts 1411 are used for being electrically connected to the second metal contacts 1221. Although the present invention proposes an implementation in which two third metal contacts 1411 correspond to two second metal contacts 1221, the number and positions of the corresponding third metal contacts 1411 may also be adjusted according to the number and arrangement positions of the second metal contacts 1221 during actual application, but are not limited to the implementation proposed in the present invention.

The reinforcing plate 15 has an upper surface 151 and a lower surface 152. A second film layer 1511 is arranged on the upper surface 151 and is used for bonding the reinforcing plate 15 with the lower surface 142 of the FPC 14, so as to improve mechanical strength of the FPC 14. The reinforcing plate 15 is made of a metal material. In a preferred implementation, a material of the reinforcing plate 15 may be: stainless steel, tungsten steel, aluminum or tin plate. The second film layer 1511 is a thermosetting conductive double-sided adhesive.

Figure 3:
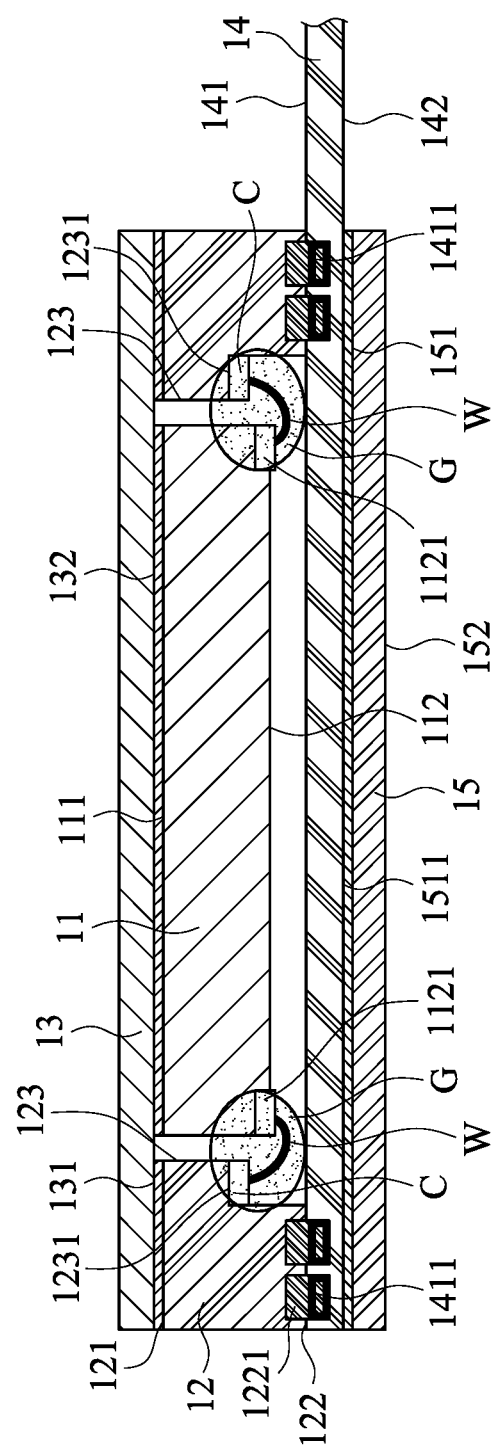
FIG. 3 is a cross-sectional view of a package structure of a fingerprint identification chip according to the present invention.

Next, referring to FIG. 3, FIG. 3 is a cross-sectional view of a package structure of a fingerprint identification chip according to the present invention. In FIG. 3, the cover plate 13 is bonded with the first surface 121 of the substrate 12 by using the first film layer 131, so that the cover plate 13 can be fixedly disposed on the first surface 121 of the substrate 12. On the other hand, the cover plate 13 may also cover the upper surface 111 of the fingerprint identification chip 11 and is bonded with the upper surface 111 of the fingerprint identification chip 11 by using the mucilage layer 132, so as to fix the fingerprint identification chip 11. The mechanical strength of the fingerprint identification chip 11 is improved by means of the substrate 12 surrounding the periphery of the fingerprint identification chip 11, so that the fingerprint identification chip 11 can be firmly disposed in the penetrating opening 123 of the substrate 12.

The FPC 14 is disposed on the second surface 122 of the substrate 12. Besides, an anisotropic conductive film (ACF) (which is not shown in the figure) may be arranged on the upper surface 141 of the FPC 14 or on the second surface 122 of the substrate 12. The FPC 14 is bonded with the second surface 122 of the substrate 12 by using the ACF. In addition, the third metal contact 1411 is arranged at a position corresponding to the second metal contact 1221, such that the third metal contact 1411 and the second metal contact 1221 can be bonded to generate an electrical connection.

Next, the bonding pad 1121 arranged on the lower surface 112 of the fingerprint identification chip 11 is electrically connected to the first metal contact C in the groove 1231 of the substrate 12 through a wire W. Subsequently, a colloid G may be coated at positions of the bonding pad 1121, the wire W and the first metal contact C, so as to protect the bonding pad 1121, the wire W and the first metal contact C to avoid the bonding pad 1121, the wire W and the first metal contact C from being oxidized or being corroded under the effect of moisture in an external environment. In this way, the mechanical strength and impact resistance of the wire W can also be improved. The colloid W is an underfill. In another preferred implementation of the present invention, an elastic curing adhesive (not shown in the figure) may also be filled between the fingerprint identification chip 11 and the FPC 14, so as to improve the impact resistance of the entire package structure 10 of the fingerprint identification chip. Although the present invention proposes an implementation of extending two grooves 1231 from two opposite side edges of the penetrating opening 123 and accommodating the first metal contacts C in the grooves 1231, the forming positions and number of the grooves 1231 may also be adjusted according to the number and arrangement positions of the bonding pads 1121 on the lower surface 112 of the fingerprint identification chip 11 in actual application, but are not limited to the implementation proposed in the present invention. For example, when the bonding pads 1121 are arranged on one side edge of the lower surface 112 of the fingerprint identification chip 11 by using the TSV process technology and the RDL process technology, a groove 1231 may extend from the corresponding same side of the penetrating opening 123 to accommodate the first metal contact C and it is unnecessary to additionally provide another groove 1231 for accommodating the first metal contact C.

Referring to FIG. 3 continuously, in FIG. 3, the thickness of the cover plate 13 is between 90 μm and 110 μm. The thickness of the first film layer 131 is approximately 20 μm. The thickness of the substrate 12 is between 295 μm and 305 μm. The thickness of the ACF (not shown in the figure) is between 10 μm and 25 μm. The thickness of the FPC 14 is 120 μm. The thickness of the second film layer 151 is approximately 20 μm. The thickness of the reinforcing plate 15 is between 145 μm and 155 μm. In this way, the overall thickness of the package structure 10 of the fingerprint identification chip may be between 700 μm and 755 μm. In a preferred implementation, the thickness of the cover plate 13 is 100 μm; the thickness of the first film layer 131 is approximately 20 μm; the thickness of the substrate 12 is 300 μm; the thickness of the ACF (not shown in the figure) is 10 μm; the thickness of the FPC 14 is 120 μm; the thickness of the second film layer 151 is approximately 20 μm; and the thickness of the reinforcing plate 15 is 150 μm. The overall thickness of the package structure 10 of the fingerprint identification chip is 720 μm.

Compared with the prior art, the present invention provides a thin package structure of a fingerprint identification chip, so as to reduce space required when the fingerprint identification chip is configured in an electronic device. In this way, the flexibility and degree of freedom of electronic circuit configuration inside the electronic device can be effectively improved. On the other hand, the existing epoxy molding resin chip package is replaced with a substrate package. Because the substrate surrounds the periphery of the fingerprint identification chip, an annular reinforcement effect is achieved, so that the package structure of the fingerprint identification chip becomes thin while maintaining desirable mechanical strength. Moreover, the substrate package does not cause the problem of different expansion ratios of materials, thereby avoiding warping of the appearance of the package structure of the fingerprint identification chip. Therefore, the present invention is a creation with great industrial value.

Various modifications may be made to the present invention by a person skilled in the art without departing from the protection scope of the appended claims.

What is claimed is:

1. A package structure of a fingerprint identification chip, comprising:
    a substrate, having a first surface, a second surface and a penetrating opening penetrating the first surface and the second surface, the second surface comprising at least one groove extending from the penetrating opening and at least one second metal contact, and the at least one groove being used for accommodating a first metal contact;
    a fingerprint identification chip, disposed in the penetrating opening and having an upper surface and a lower surface, the lower surface having at least one bonding pad;
    a cover plate, fixedly disposed on the first surface of the substrate and covering the upper surface of the fingerprint identification chip; and
    a flexible print circuit (FPC), disposed on the second surface of the substrate, a surface of the FPC having at least one third metal contact that corresponds to and is electrically connected to the at least one second metal contact,
    wherein the at least one bonding pad is electrically connected to the first metal contact through a wire.

2. The package structure of a fingerprint identification chip according to claim 1, further comprising a reinforcing plate, wherein the reinforcing plate is disposed on another surface, which is opposite to the surface having the at least one third metal contact, of the FPC.

3. The package structure of a fingerprint identification chip according to claim 1, wherein a colloid is coated on the at least one bonding pad, the wire and the first metal contact, and the colloid is an underfill.

4. The package structure of a fingerprint identification chip according to claim 1, wherein a first film layer is formed between the cover plate and the first surface of the substrate and is used for bonding the substrate and the cover plate.

5. The package structure of a fingerprint identification chip according to claim 1, wherein the cover plate comprises a mucilage layer that is formed at a position corresponding to the penetrating opening and is used for bonding the upper surface of the fingerprint identification chip.

6. The package structure of a fingerprint identification chip according to claim 2, wherein a second film layer is formed between the flexible circuit and the reinforcing plate and is used for bonding the flexible circuit and the reinforcing plate.

7. The package structure of a fingerprint identification chip according to claim 1, wherein the substrate is: a bakelite board, a glass-fiber board, a plastic sheet or a ceramic plate.

8. The package structure of a fingerprint identification chip according to claim 1, wherein a material of the cover plate is: ceramic or glass.

9. The package structure of a fingerprint identification chip according to claim 2, wherein a material of the reinforcing plate is: stainless steel, tungsten steel, aluminum or tin plate.

10. The package structure of a fingerprint identification chip according to claim 1, wherein the thickness of the substrate is between 295 μm and 305 μm.

11. The package structure of a fingerprint identification chip according to claim 10, wherein the thickness of the substrate is 300 μm.

12. The package structure of a fingerprint identification chip according to claim 1, wherein the thickness of the cover plate is between 90 μm and 110 μm.

13. The package structure of a fingerprint identification chip according to claim 12, wherein the thickness of the cover plate is 100 μm.

14. The package structure of a fingerprint identification chip according to claim 2, wherein the thickness of the reinforcing plate is between 145 μm and 155 μm.

15. The package structure of a fingerprint identification chip according to claim 14, wherein the thickness of the reinforcing plate is 150 μm.

* * * * *